United States Patent
Reboh

(10) Patent No.: US 11,121,231 B2
(45) Date of Patent: Sep. 14, 2021

(54) METHOD OF MANUFACTURING A FIELD EFFECT TRANSISTOR WITH OPTIMIZED PERFORMANCES

(71) Applicant: Commissariat A L'Energie Atomique et aux Energies Alternatives, Paris (FR)

(72) Inventor: Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/718,466

(22) Filed: Dec. 18, 2019

(65) Prior Publication Data

US 2020/0235226 A1    Jul. 23, 2020

(30) Foreign Application Priority Data

Dec. 18, 2018  (FR) ...................... 18 73209

(51) Int. Cl.
*H01L 29/66*    (2006.01)
*H01L 21/02*    (2006.01)
(Continued)

(52) U.S. Cl.
CPC .. *H01L 29/66545* (2013.01); *H01L 21/02532* (2013.01); *H01L 21/02603* (2013.01);
(Continued)

(58) Field of Classification Search
CPC ......... H01L 21/02521; H01L 21/02532; H01L 21/02603; H01L 21/30; H01L 21/302;
(Continued)

(56) References Cited

U.S. PATENT DOCUMENTS

2011/0303951 A1* 12/2011 Zhu ................... H01L 29/66545
257/192
2013/0001706 A1* 1/2013 Haran ..................... H01L 21/84
257/410

(Continued)

OTHER PUBLICATIONS

French Preliminary Search Report dated Oct. 14, 2019 in French Application 18 73209 filed on Dec. 18, 2018 (with English Translation of Categories of Cited Documents & Written Opinion), 9 pages.

*Primary Examiner* — Cheung Lee
(74) *Attorney, Agent, or Firm* — Oblon, McClelland, Maier & Neustadt, L.L.P.

(57) ABSTRACT

A method for fabricating a field-effect transistor includes: providing a structure including a first layer of semiconductor material, a doped second layer of semiconductor material arranged on top of the first layer of semiconductor material, the composition of which is different from that of the first layer, two spacers made of dielectric material arranged on top of the second layer of semiconductor material and separated by a groove, the second layer of semiconductor material being accessible at the bottom of the groove; etching the second layer of semiconductor material at the bottom of the groove until reaching the first layer of semiconductor material in such a way as to retain the second layer of semiconductor material beneath the spacers on either side of the groove; and then forming a gate stack in the groove.

16 Claims, 15 Drawing Sheets

(51) Int. Cl.
  *H01L 21/3065* (2006.01)
  *H01L 29/06* (2006.01)
  *H01L 29/423* (2006.01)
  *H01L 29/786* (2006.01)

(52) U.S. Cl.
  CPC ...... *H01L 21/3065* (2013.01); *H01L 29/0673* (2013.01); *H01L 29/42392* (2013.01); *H01L 29/66553* (2013.01); *H01L 29/66742* (2013.01); *H01L 29/78684* (2013.01); *H01L 29/78696* (2013.01)

(58) Field of Classification Search
  CPC ............. H01L 21/306; H01L 21/30604; H01L 21/3065; H01L 21/70; H01L 21/8232; H01L 21/823412; H01L 21/823437; H01L 21/823487; H01L 21/8238; H01L 21/823807; H01L 21/823828; H01L 21/823885; H01L 29/06; H01L 29/0673; H01L 29/42384; H01L 29/42392; H01L 29/66545; H01L 29/66553; H01L 29/66742; H01L 29/772; H01L 29/786; H01L 29/78684; H01L 29/78696
  See application file for complete search history.

(56) References Cited

U.S. PATENT DOCUMENTS

2014/0027818 A1  1/2014  Asenov
2014/0027854 A1  1/2014  Asenov
2015/0011056 A1  1/2015  Kapoor et al.

\* cited by examiner

[Fig. 1]
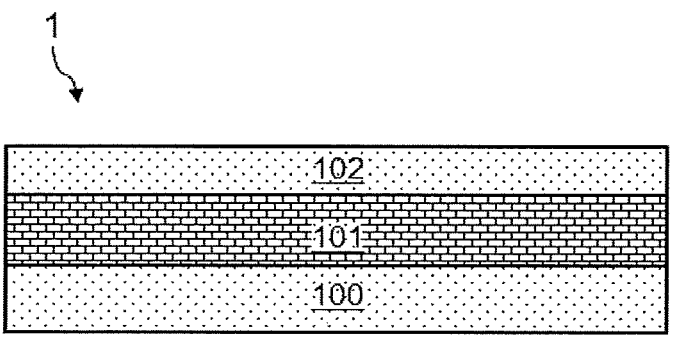
[Fig. 2]
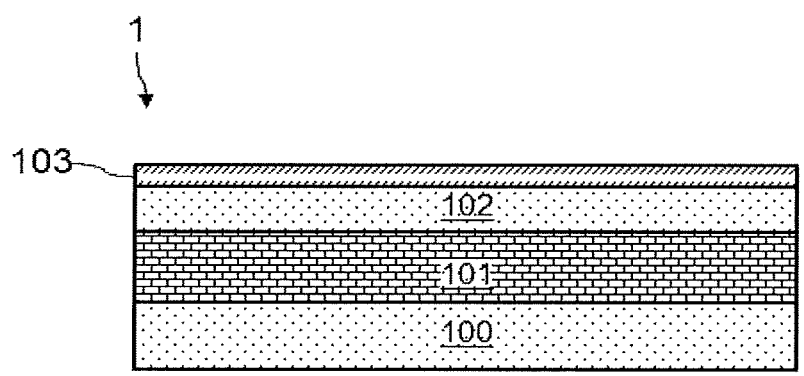
[Fig. 3]
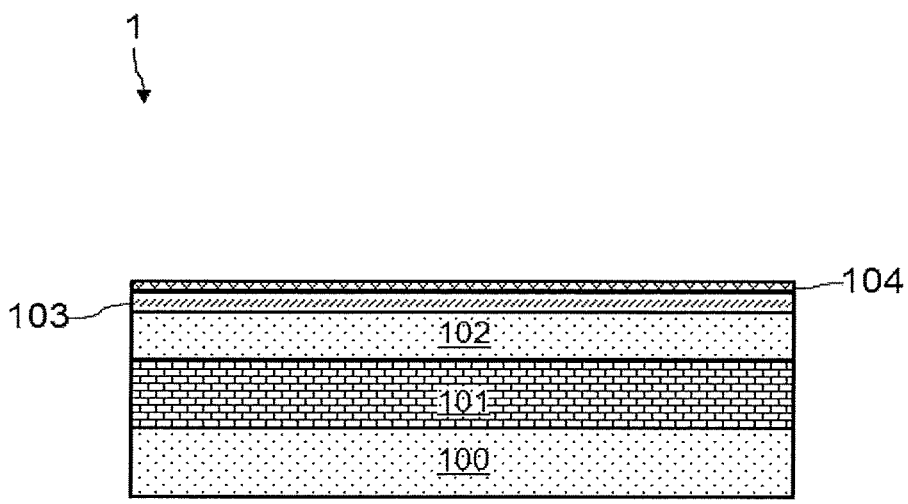

[Fig. 4]
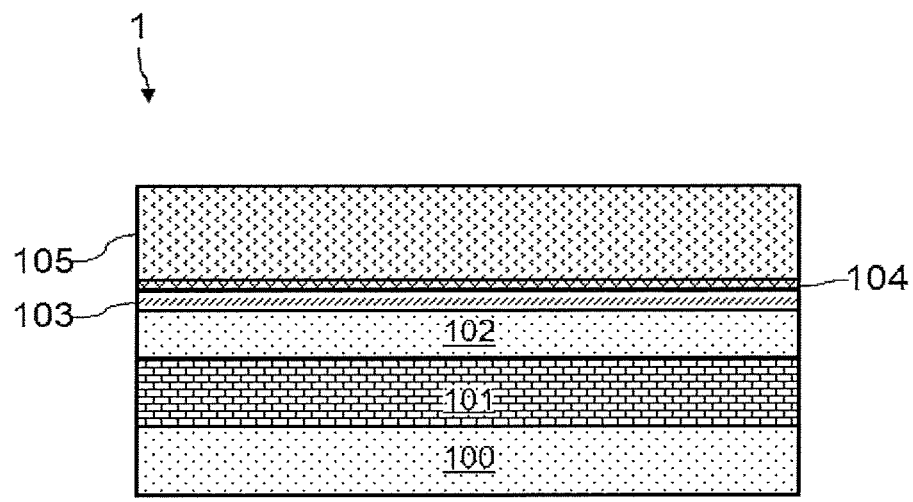
[Fig. 5]
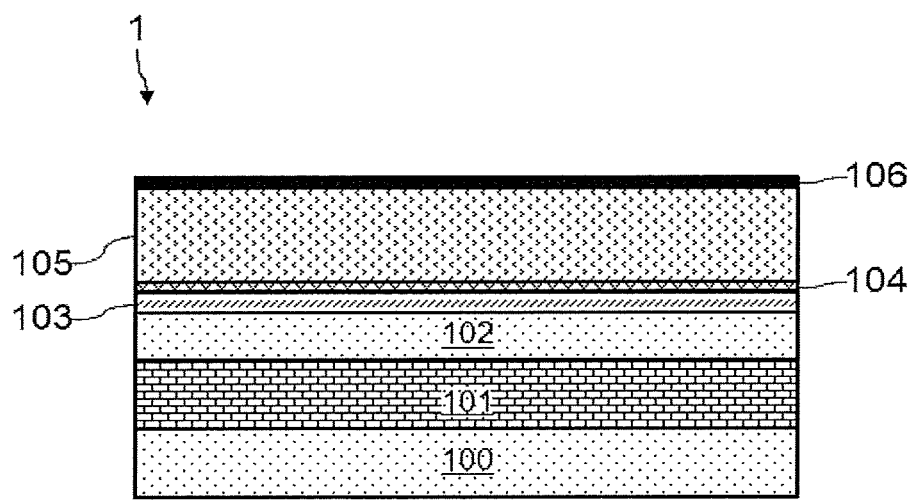

[Fig. 6]
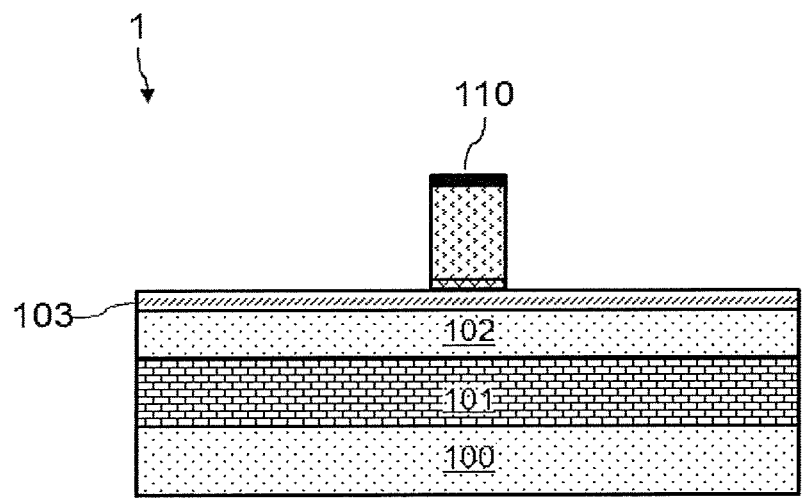
[Fig. 7]
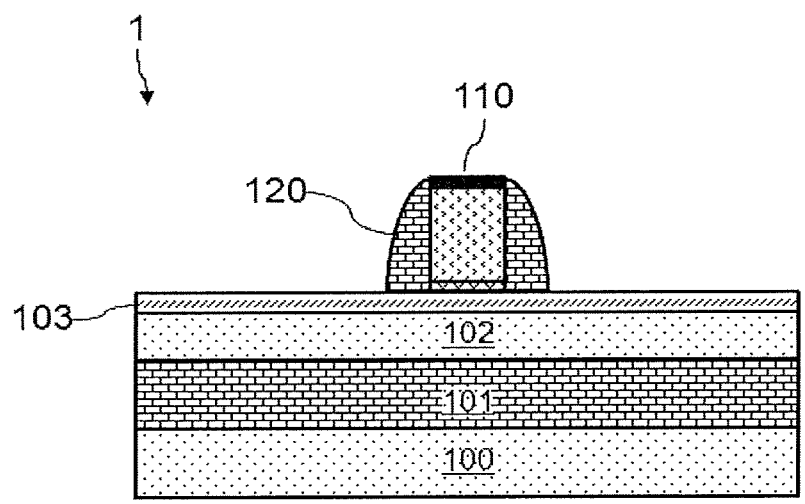

[Fig. 8]
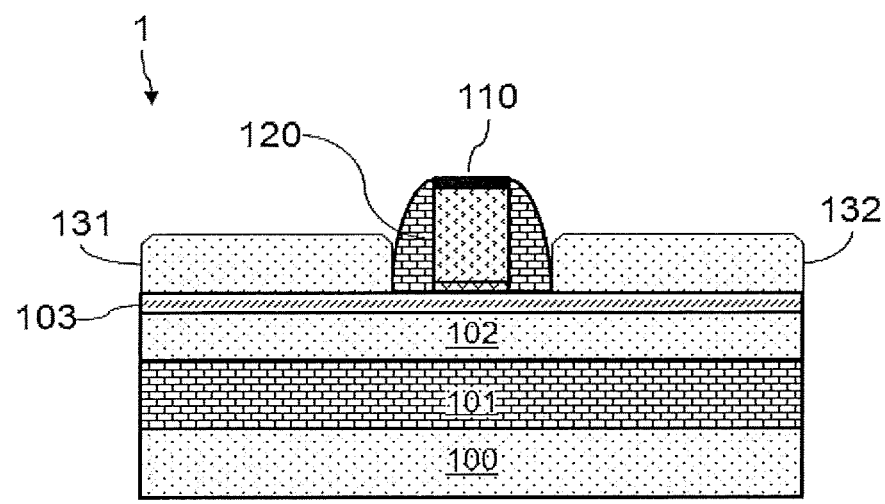
[Fig. 9]
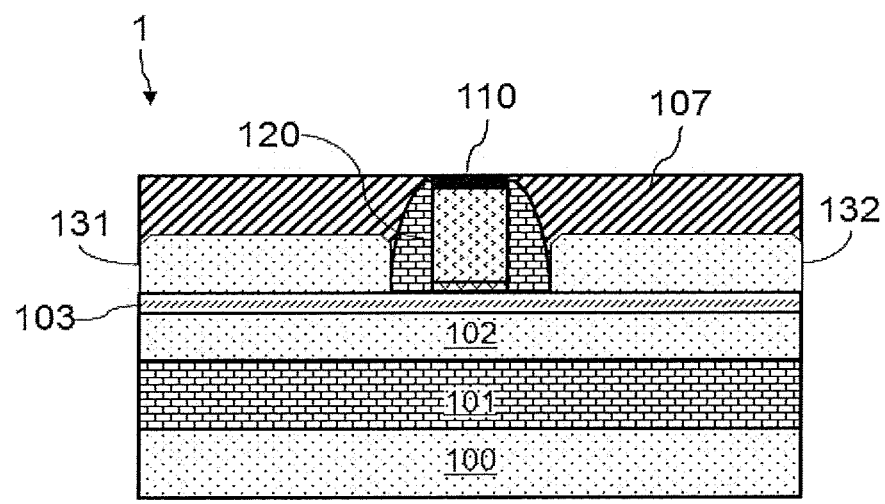

[Fig. 10]
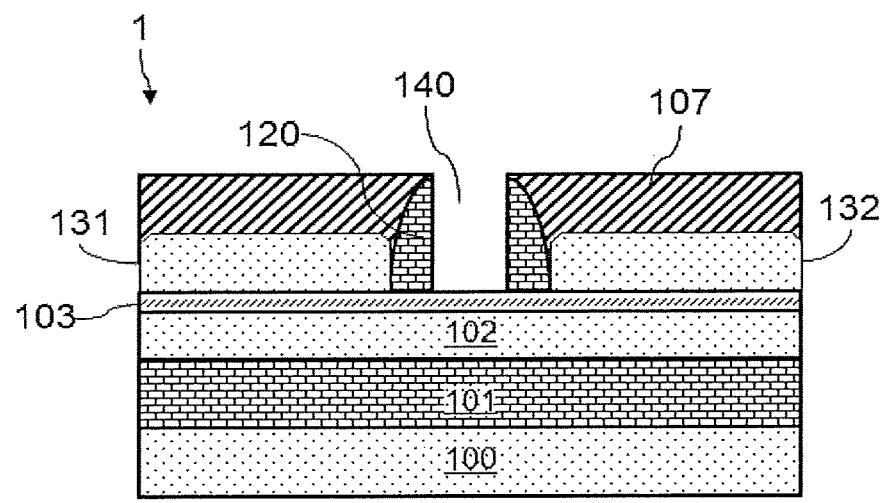
[Fig. 11]
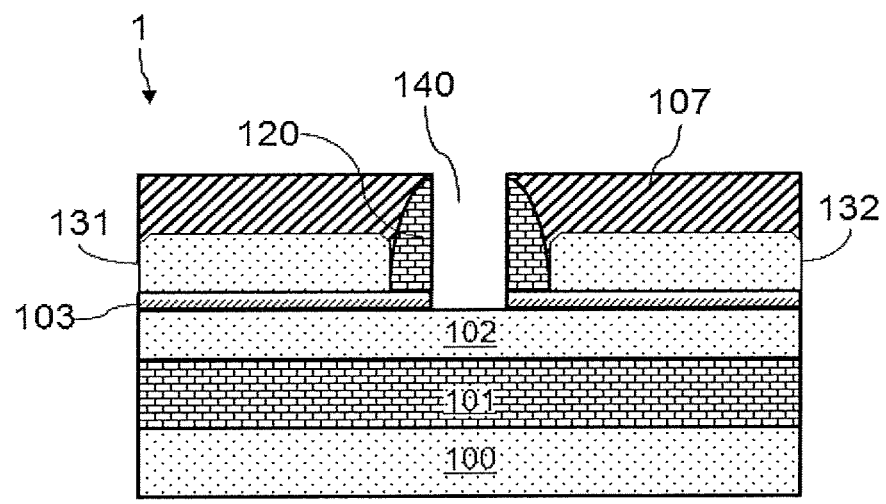

[Fig. 12]
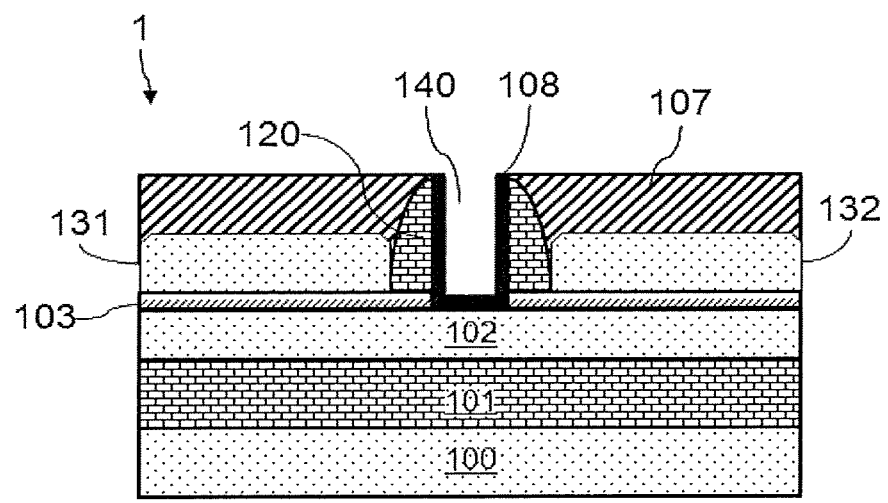
[Fig. 13]
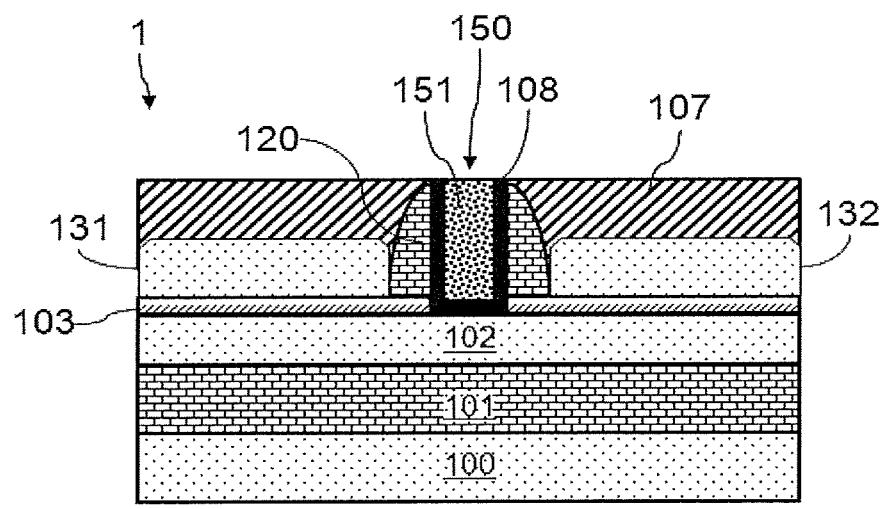

[Fig. 14]
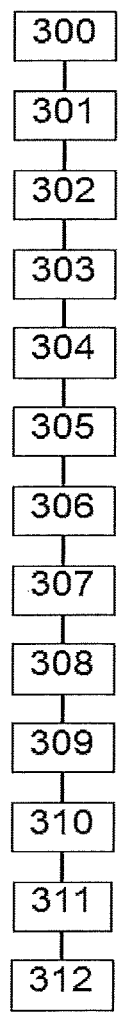

[Fig. 15]
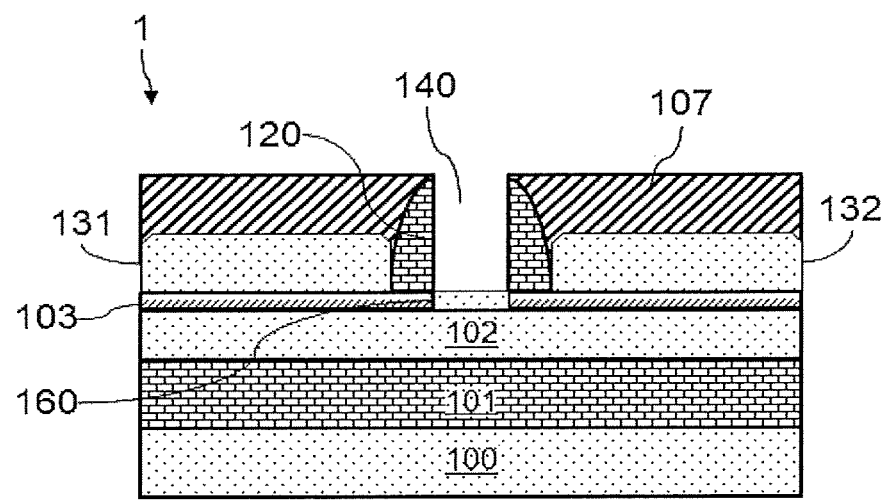
[Fig. 16]
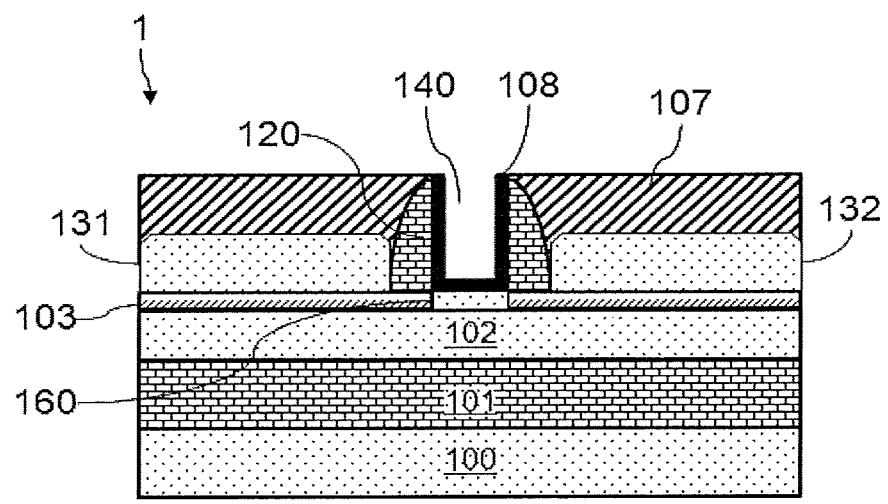

[Fig. 17]
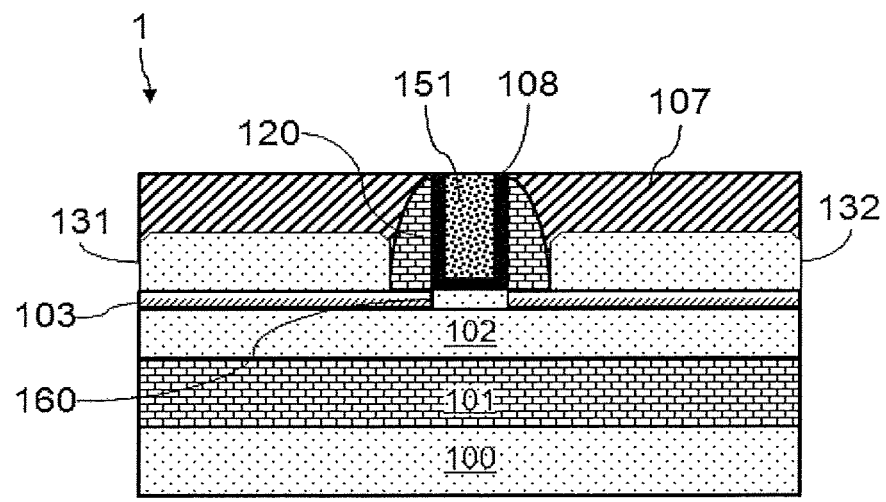
[Fig. 18]
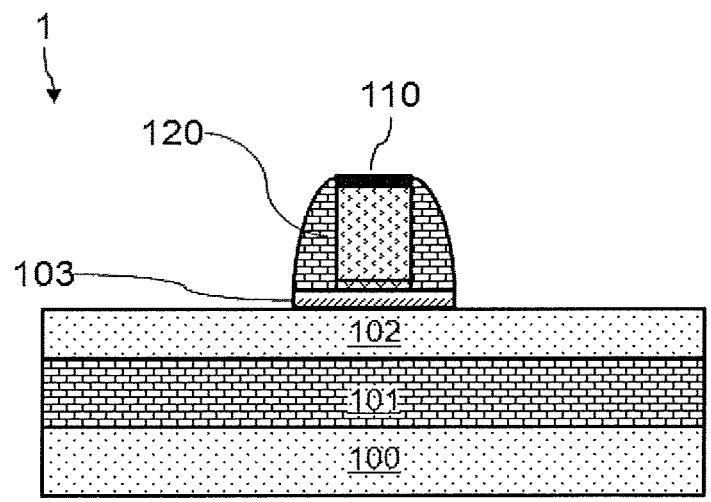

[Fig. 19]
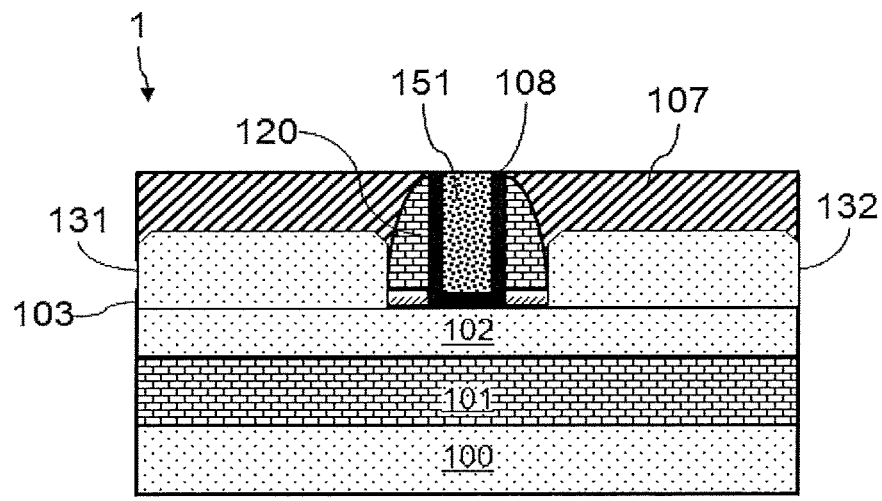
[Fig. 20]
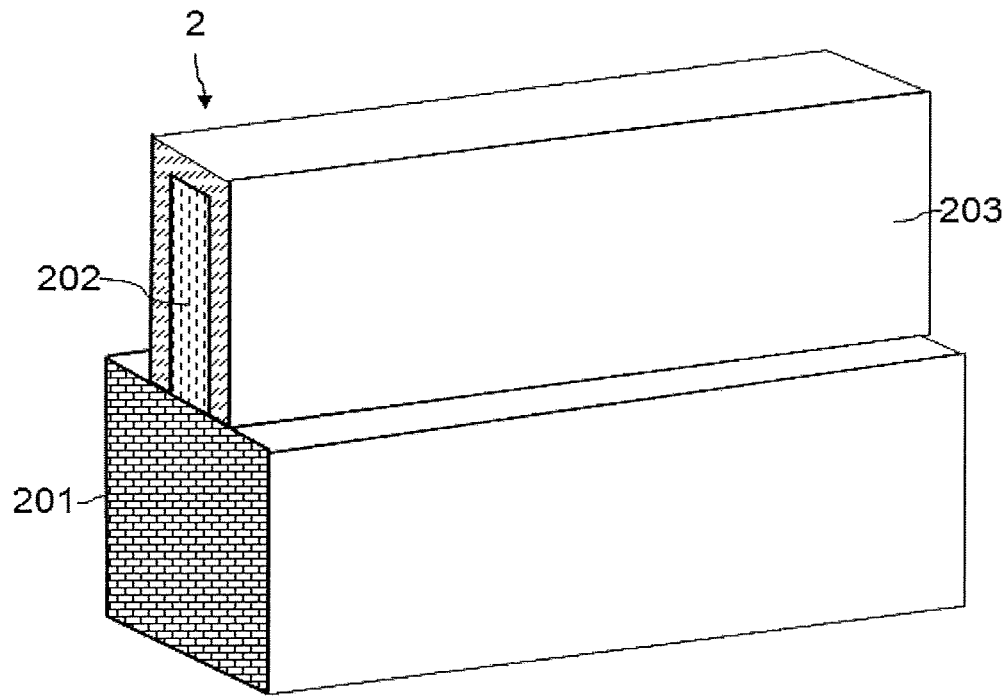

[Fig. 21]
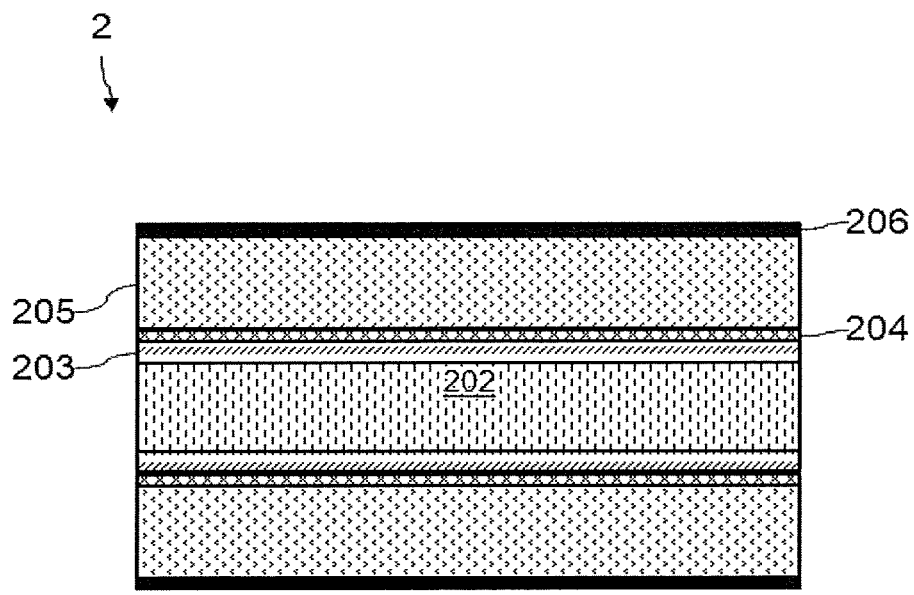
[Fig. 22]
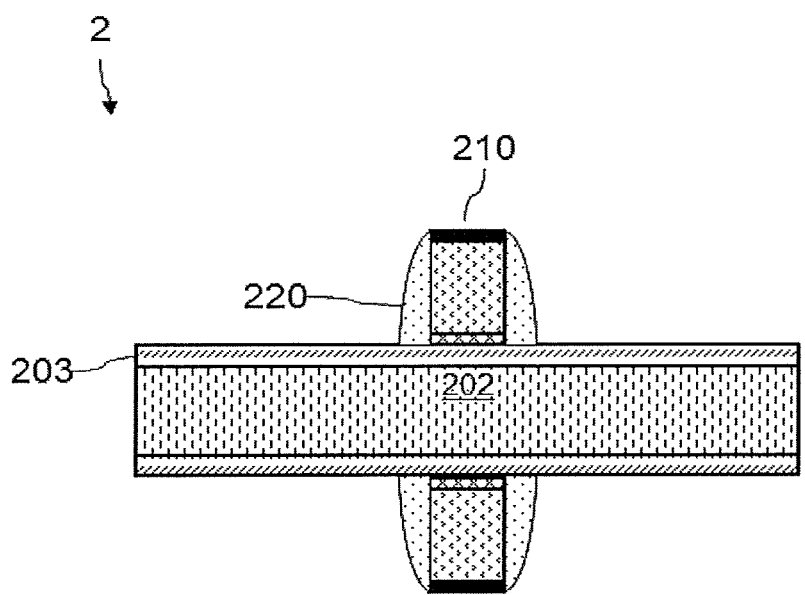

[Fig. 23]
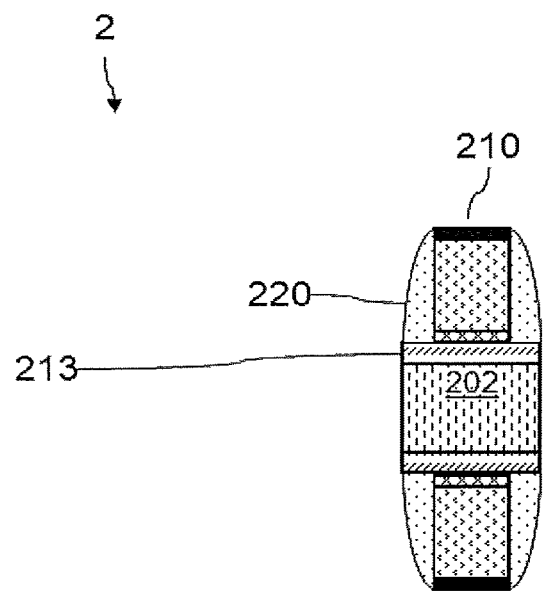
[Fig. 24]
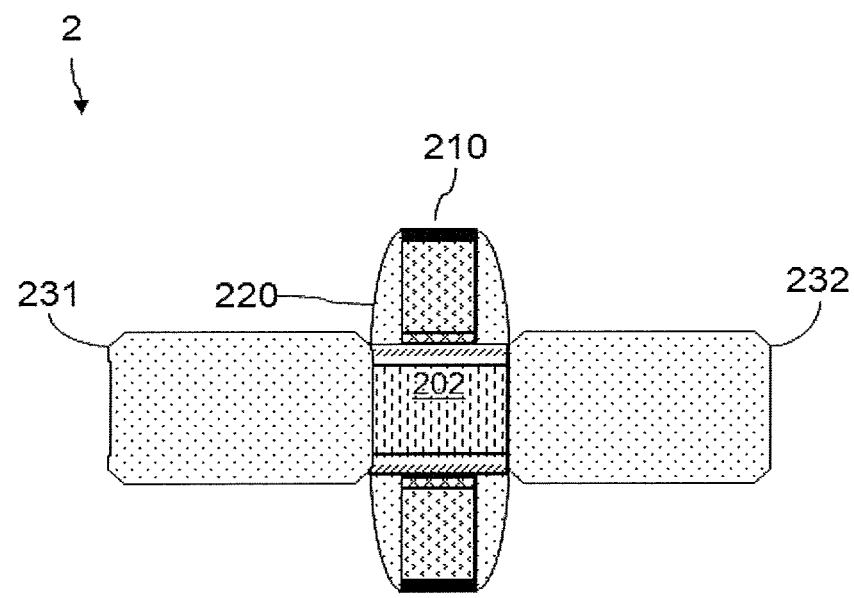

[Fig. 25]
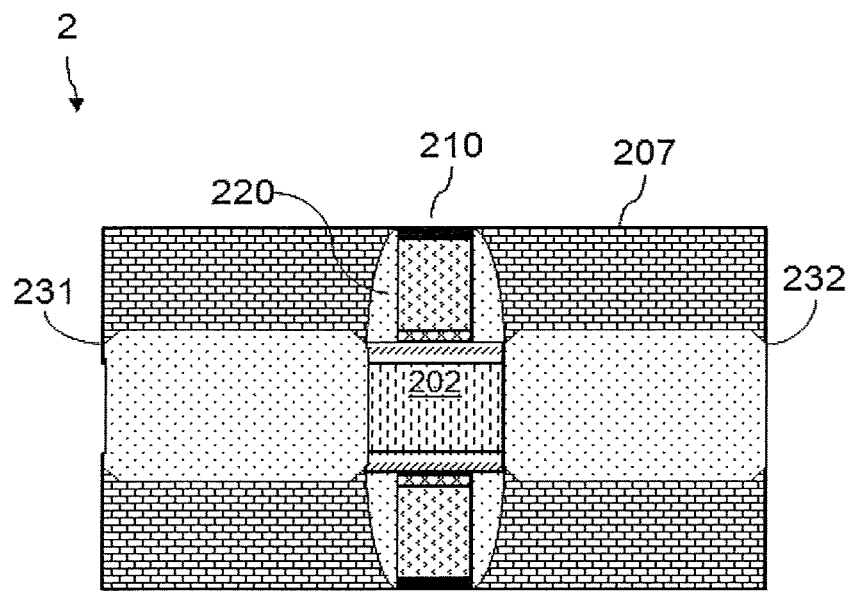
[Fig. 26]
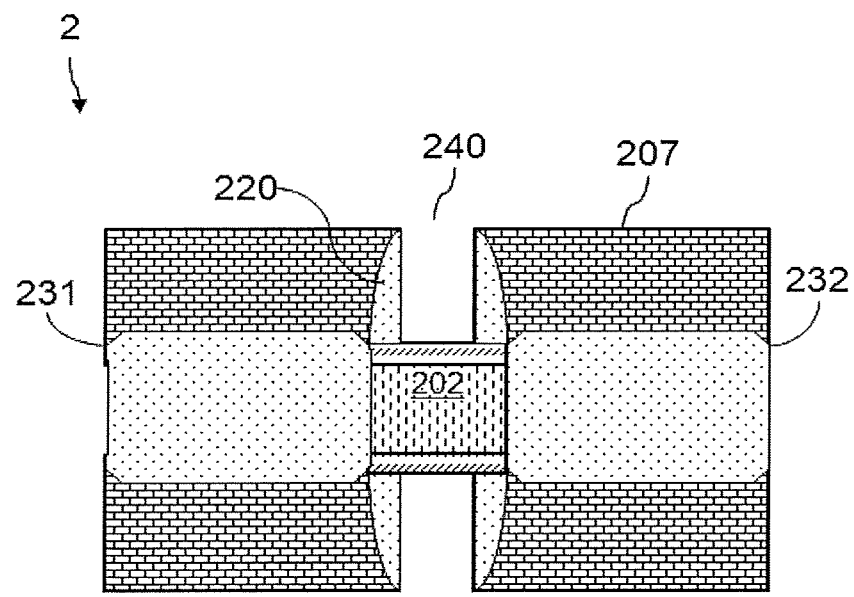

[Fig. 27]
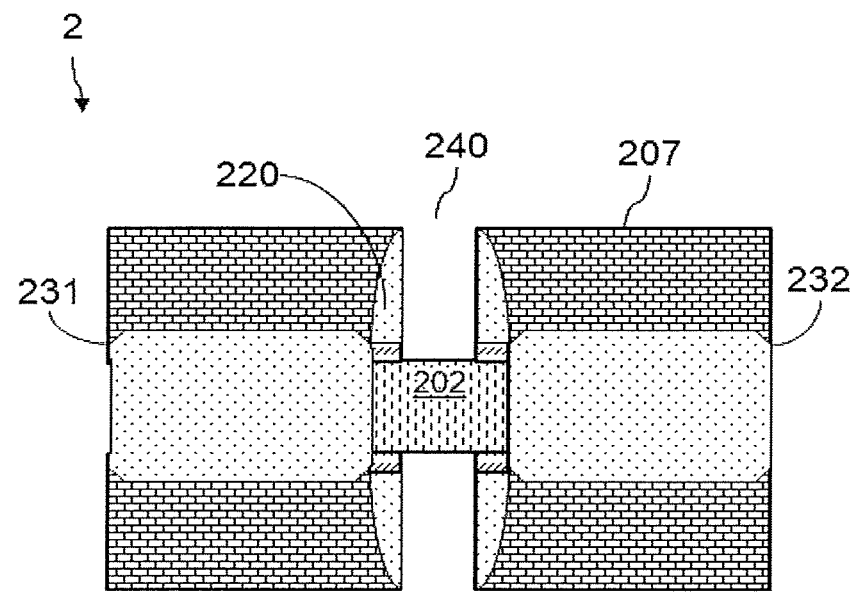
[Fig. 28]
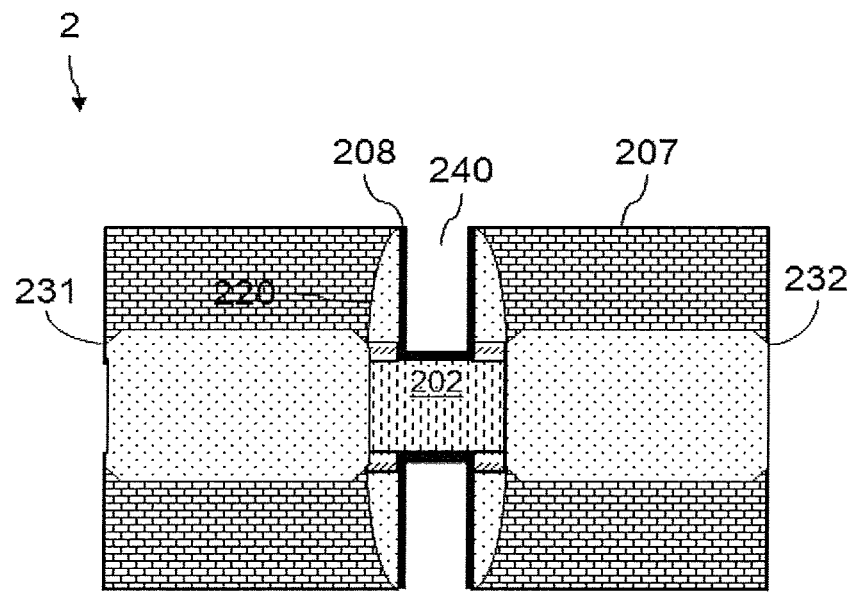

[Fig. 29]
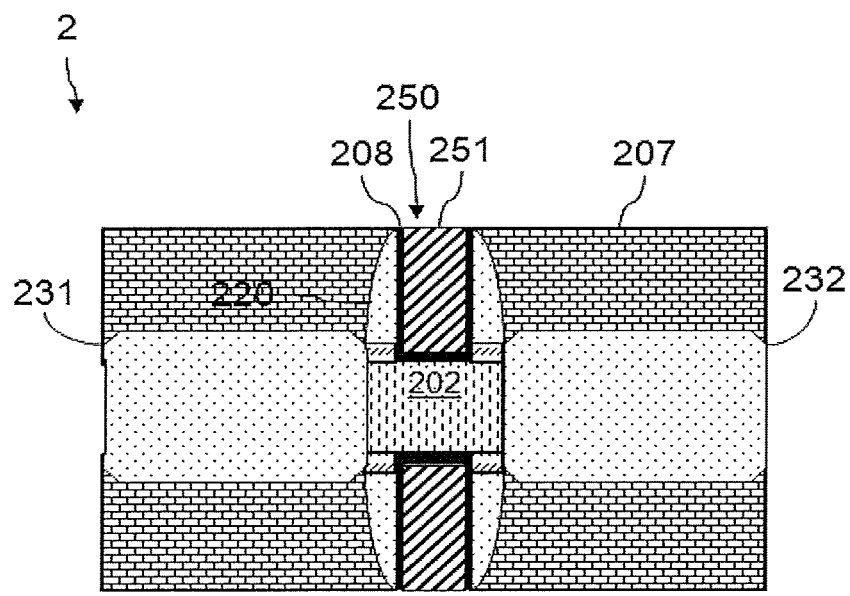
[Fig. 30]
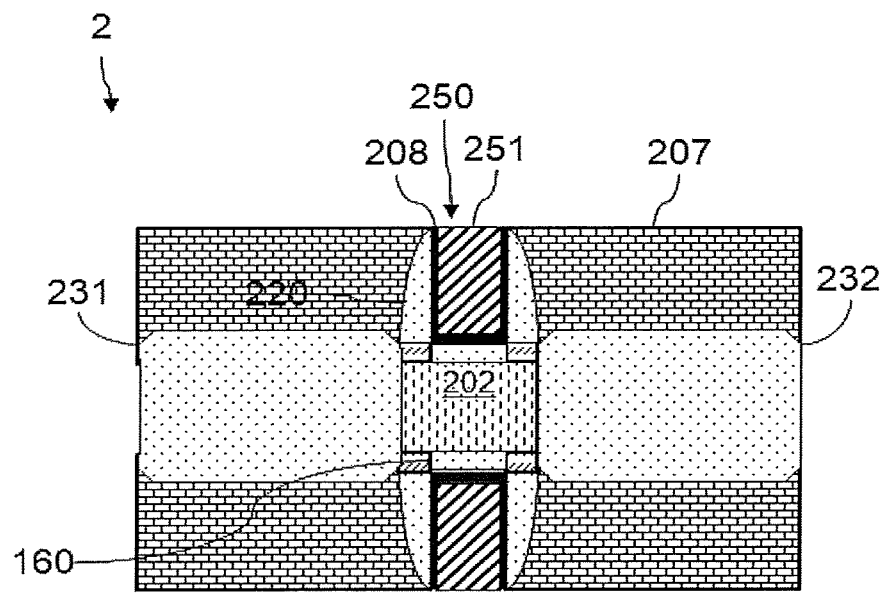

METHOD OF MANUFACTURING A FIELD EFFECT TRANSISTOR WITH OPTIMIZED PERFORMANCES

CROSS REFERENCE TO RELATED APPLICATIONS

This application priority to French Patent Application No. 1873209, flied on Dec. 18, 2018, the entire contents of which are incorporated herein by reference.

The invention relates to field effect transistors, and in particular to methods for fabricating such transistors that are compatible with three-dimensional integration methods.

BACKGROUND OF THE INVENTION

To decrease the cost of integrated circuits and to increase their performance, manufacturers are constantly decreasing the size of transistors, increasing the number thereof per chip, and increasing the number of circuits produced in parallel. To allow this increase in the performance of integrated circuits, technologists are consequently geometrically decreasing the size of the transistors in the active portion, along with the size of the interconnections. However, decreasing the technology node below 10 nm is problematic.

With a view to increasing integration density and/or decreasing the distance between electronic components, it is known practice to carry out 3D integration by superposing a second active layer of electronic components over the interconnect layer of a first active layer produced beforehand.

In three-dimensional integration methods, any heating step in the formation of a second active layer over the intermediate interconnect layer comes with a high risk of damaging the first active layer.

Doped source and drain formation generally requires dopant activation and the diffusion of these dopants at temperatures exceeding 1000° C. Such temperatures cannot be applied in the formation of the second active layer without damaging the first active layer.

A fabrication method has been proposed for decreasing the temperatures applied to activate dopants in a source or drain. According to such a method, a layer of crystalline silicon that is not intentionally doped is provided beforehand and arranged on top of a buried dielectric layer. A gate stack is formed on top of the layer of crystalline silicon. Spacers made of dielectric material are formed on either side of the gate stack. The upper portion of the silicon layer on either side of the assembly including the gate stack and the spacers is then amorphized. The amorphization method is carried out by means of ion bombardment. Next, dopants are introduced by ion implantation into the amorphous silicon. A step of solid-phase recrystallization is then carried out at a temperature below 600° C. for the purpose of recrystallizing the silicon layer and incorporating activated dopants into the crystalline structure formed.

It is desirable to be able to dope the silicon layer as close as possible up to the channel of the transistor to be formed, in particular to decrease access resistance. Thus, the silicon layer should advantageously be doped beneath the spacers. Doping beneath the spacers in this way is relatively difficult to achieve and to control. To promote greater proximity between the doped layer and the channel zone, one known method proposes producing very thin spacers beforehand on either side of the gate stack. Ion implantation is then carried out as described above on either side of the assembly including the gate stack and these thin spacers, then thicker spacers are formed over the thin spacers.

However, such a method has drawbacks. First, the zone beneath the very thin spacers cannot always be doped as desired. Second, the silicon layer on top of the buried dielectric is generally very thin, generally less than 9 nm thick. To be able to carry out the step of recrystallizing the silicon layer, it is necessary to retain crystalline silicon at the interface with the buried dielectric after the amorphization step. With the thinness of the silicon layer, retaining crystalline silicon in this way is difficult.

Additionally, the amorphization step results in the presence of residual defects after recrystallization. Such residual defects may affect the characteristics of the transistor formed.

The invention aims to overcome one or more of these drawbacks. Thus, the invention relates to a method for fabricating a field-effect transistor such as defined in the appended claims.

The invention also relates to the variants of the dependent claims. A person skilled in the art will understand that each of the features in the description or in the dependent claims may be independently combined with the features of an independent claim without, however, constituting an intermediate generalization.

BRIEF DESCRIPTION OF THE SEVERAL VIEWS OF THE DRAWINGS

Other features and advantages of the invention will become clearly apparent from the description thereof that is given hereinafter, by way of indication and without any limitation, with reference to the appended drawings, in which:

FIG. 1,
FIG. 2,
FIG. 3,
FIG. 4,
FIG. 5,
FIG. 6,
FIG. 7,
FIG. 8,
FIG. 9,
FIG. 10,
FIG. 11,
FIG. 12 and
FIG. 13 are sectional views of a field-effect transistor at various steps in its fabrication method according to a first embodiment;
FIG. 14 is a diagram illustrating the steps in the fabrication method according to the first embodiment;
FIG. 15,
FIG. 16 and
FIG. 17 are sectional views of a field-effect transistor at various steps in its fabrication method according to a second embodiment;
FIG. 18 and
FIG. 19 are sectional views of a field-effect transistor at various steps in its fabrication method according to a third embodiment;
FIG. 20 is a perspective view of a field-effect transistor at a step in a fabrication method according to a fourth embodiment;
FIG. 21 is a perspective view of a field-effect transistor at an intermediate step in its fabrication method according to a fourth embodiment;

FIG. 22,
FIG. 23,
FIG. 24,
FIG. 25,
FIG. 26,
FIG. 27,
FIG. 28 and
FIG. 29 are sectional views of a field-effect transistor at various steps in its fabrication method according to the fourth embodiment;

FIG. 30 is a sectional view of a field-effect transistor at a step in its fabrication method according to a fifth embodiment.

DETAILED DESCRIPTION OF THE INVENTION

FIGS. 1 to 13 are sectional views of a field-effect transistor 1 at various steps in its fabrication method according to a first embodiment. The diagram of FIG. 14 summarizes the steps in the fabrication method according to the first embodiment. The invention may be implemented from step 308, starting from the configuration illustrated in FIG. 10. However, examples of prior steps with a view to obtaining the configuration illustrated in FIG. 10 will be described.

In step 300, a substrate provided with a layer 102 of semiconductor material, for example a silicon alloy, for example silicon that is not intentionally doped, is provided (the layer 102 described below will be made of silicon that is not intentionally doped or of SiGe that is not intentionally doped). The thickness of the layer of silicon 102 is between 6 and 20 nm, for example 6 nm. The layer of silicon 102 is here formed on top of a buried insulating layer 101, for example made of $SiO_2$ (the layer 101 described below will be made of $SiO_2$). The thickness of the layer 101 is typically between 10 and 50 nm, for example 20 nm. The buried insulating layer 101 is formed on top of a substrate 100, which is typically made of silicon that is not intentionally doped (the layer 100 described below will be made of silicon that is not intentionally doped). The invention may however also be applied with a layer 102 belonging to a bulk substrate.

In step 301, a layer 103 made of doped semiconductor material alloy is formed on top of the layer 102, as illustrated in FIG. 2. The composition of the layer 103 is different from that of the layer 102. The doping of the layer 103 is in particular intended to improve the conduction properties between a channel zone and a source and drain of the transistor to be fabricated. The layer 103 is typically deposited by epitaxial growth on top of the layer 102. The thickness of the layer 103 is typically between 2 and 10 nm. The layer 103 may be doped in situ during the epitaxial growth operation or by ion implantation later on.

The layer 103 is typically made of SiGe or silicon alloy. To form an nMOS transistor, the doping of the layer 103 could be n-doping in a layer of silicon alloy. The n-type dopant is phosphorus, for example. To form a pMOS transistor, the doping of the layer 103 could be p-doping in a layer of SiGe alloy. The p-type dopant is boron, for example. The germanium concentration of the layer 103 is for example between 15% and 60% (in terms of number of atoms). The operation of deposition by epitaxial growth is for example carried out using SiGe with 30% germanium at a temperature of 630° C., using $H_2$ as the carrier gas, and germane ($GeH_4$) and dichlorosilane (DCS, $SiH_2Cl_2$) as precursors. The operation of deposition by epitaxial growth may also be carried out using SiGe with 10% germanium at a temperature of 700° C., using $H_2$ as the carrier gas, and germane ($GeH_4$) and silane ($SiH_4$) as precursors. Advantageously, the layer 103 is pseudomorphic, i.e. its thickness is less than its critical thickness for relaxation, from which critical thickness it begins to undergo plastic relaxation.

In steps 302 to 305, steps of fabricating a sacrificial gate are implemented.

In step 302, a protective layer 104 is formed on top of the layer 103, as illustrated in FIG. 3. The layer 104 is typically made of $SiO_2$. The thickness of this layer 104 is typically between 2 and 10 nm.

In step 303, a layer 105 made of amorphous silicon is formed on top of the protective layer 104, as illustrated in FIG. 4.

In step 304, a hardmask layer 106 is formed on top of the layer of amorphous silicon 105, as illustrated in FIG. 5. The hardmask layer 106 is for example formed of SiN. A layer of oxide, the thickness of which is between 2 and 10 nm, may also be inserted between the layers 105 and 106.

In step 305, a lithography step is carried out to form a hardmask in the layer 106. Next, a step of anisotropically etching the layer 105 and the layer 104 following the etch mask is carried out in order to form the sacrificial gate stack 110. The stack is etched down to the layer 103 in order to obtain the configuration illustrated in FIG. 6.

In step 306, spacers 120 are formed on top of the layer 103, on either side of the sacrificial gate stack 110, in order to obtain the configuration illustrated in FIG. 7. The formation of the spacers 120 may be implemented by conformal deposition of SiN, then by anisotropically etching this layer of SiN until the layer 103 is exposed. The width of the spacers 120 formed may for example be between 5 and 10 nm.

In step 307, a raised source 131 and drain 132 are formed on top of the layer 103, on either side of the assembly including the spacers 120 and the sacrificial gate stack 110, in order to obtain the configuration illustrated in FIG. 8. The source 131 and the drain 132 are typically formed by epitaxial deposition of a silicon alloy on top of the layer 103.

In step 308, a protective layer 107 is formed on top of the source 131 and the drain 132, on either side of the assembly including the spacers 120 and the sacrificial gate stack 110, in order to obtain the configuration illustrated in FIG. 9. The operation of forming the protective layer 107 typically comprises an operation of depositing dielectric, typically based on $SiO_2$, followed by a chemical-mechanical-polishing operation that stops at the hardmask of the sacrificial gate stack 110.

In step 309, the hardmask and the sacrificial gate stack 110 are removed to form a groove 140 between the spacers 120. The width of the groove 140 thus obtained is advantageously at most equal to 40 nm. The configuration illustrated in FIG. 10 is then obtained. This removal operation is for example carried out by selective etching (with respect to the material of the spacers 120 and to the material of the protective layer 107 in particular) which stops at the layer 104. The layer 104 may then be removed. The layer 103 is then accessible at the bottom of the groove 140 and delimits the bottom of this groove 140. The etch may for example be isotropic, by means of plasma etching.

In step 310 (which step may be carried out as a continuation of step 309), the layer 103 is etched at the bottom of the groove 140 down to the layer 102, stopping at this layer 102. The layer 102 may also be etched slightly. The configuration illustrated in FIG. 11 is then obtained. The layer 102 is thus at least partly retained at the bottom of the groove 140 so as to be able to form a channel zone of the transistor 1.

The flanks of the groove 140 are partly delimited by lateral faces of the etched layer 103, these lateral faces being aligned with inner lateral faces of the spacers 120. The doped portion of the accesses to the channel zone, beneath the spacers 120, runsprecisely up to this channel zone without encroaching onto this channel zone. The transistor 1 thus formed exhibits decreased channel access resistance. Such results may be obtained without requiring the prior formation of thinner spacers surmounted by a new layer of spacers. To achieve the best possible alignment between the lateral faces of the zone 103 and the lateral faces of the spacers 120, the layer 103 is advantageously anisotropically etched.

In steps 311 and 312, the gate stacks 150 are formed. The stack may include a gate insulator 108 over the lateral faces and over the bottom of the groove 140 (for example composed of a 0.5 to 2 nm stack of $SiO_2$ surmounted by 3 to 5 nm of $HfO_2$) in order to obtain the configuration illustrated in FIG. 12. The gate insulator 108 is for example deposited by conformal deposition, by atomic layer deposition.

In step 312, the method moves on to forming a gate electrode 151 in the groove 140 and over the gate insulator 108 in order to obtain the configuration illustrated in FIG. 13. The gate stack 150 is thus formed. The gate metal could for example be poly-Si or TiN. Other examples of gate stacks are described in the document "the past, present and future of high-k/metal gates", in ECS Transactions, 53 (3) 17-26, published in 2013, by Kisik Choi et al.

The steps of the method for fabricating the transistor 1 carried out according to the invention may have a thermal budget that is significantly smaller than a step in which dopants are thermally activated. The steps in a method for fabricating a transistor 1 according to the invention may thus be carried out without requiring a dopant diffusion step to be carried out.

FIGS. 15 to 17 illustrate steps in a fabrication method according to a second embodiment. The fabrication method according to the second embodiment may be implemented starting from the configuration illustrated in FIG. 11 for the first embodiment. To obtain the configuration illustrated in FIG. 15, a step of depositing, by epitaxy, a layer of semiconductor material 160 on top of the layer 102 at the bottom of the groove 140 is carried out here. The layer of semiconductor material 160 is thus configured to be included within the channel zone of the transistor. The semiconductor material 160 is for example silicon that is not intentionally doped or silicon with a doping level that is lower than that of the layer 103, when the layer 103 is made of silicon alloy. The semiconductor material 160 is for example an alloy of SiGe that is not intentionally doped or of SiGe with a doping level that is lower than that of the layer 103, when the layer 103 is made of SiGe alloy. The deposition operation 160 is advantageously carried out with a thickness that is equal to that of the layer 103. The upper face of the deposit 160 is advantageously aligned with the upper face of the layer 103.

The layer of semiconductor material 160 may be designed to exhibit mechanical strain in a plane parallel to the layer 102. Thus, for a pMOS transistor, the layer 160 will advantageously be configured to exhibit compressive strain (for example a layer 160 made of SiGe for a layer 102 made of Si), while, for an nMOS transistor, this layer 160 could be configured to exhibit tensile strain (for example a layer 160 made of Si for a layer 102 made of SiGe). Such mechanical strain allows the mobility of carriers in the channel zone of the transistor 1 formed to be increased.

To obtain the configuration illustrated in FIG. 16, a gate insulator 108 is formed on the lateral faces and at the bottom of the groove 140. The gate insulator 108 may be deposited with the same parameters as for step 311.

To obtain the configuration illustrated in FIG. 17, the method moves on to forming a gate electrode 151 in the groove 140 and over the gate insulator 108. The gate metal could for example be TiN or W.

FIGS. 18 and 19 illustrate steps in a fabrication method according to a third embodiment. The fabrication method according to the third embodiment may be implemented starting from the configuration illustrated in FIG. 7 for the first embodiment.

To obtain the configuration illustrated in FIG. 18, a step of etching the layer 103 on either side of the assembly including the sacrificial gate stack 110 and the spacers 120 is carried out.

To obtain the configuration illustrated in FIG. 19:
  a raised source 131 and drain 132 are formed on top of the layer 102, on either side of the assembly including the spacers 120 and the sacrificial gate stack 110 (for example according to parameters that are the same as those in step 307);
  a protective layer is formed on top of the source 131 and drain 132, on either side of the assembly including the spacers 120 and the sacrificial gate stack 110 (for example according to parameters that are the same as those in step 308);
  the sacrificial gate stack 110 is removed to form a groove between the spacers 120 (for example according to parameters that are the same as those in step 309);
  the layer 103 is etched at the bottom of the groove down to the layer 102 (for example according to parameters that are the same as those in step 310);
  a gate insulator 108 is formed on the lateral faces and at the bottom of the groove (for example according to parameters that are the same as those in step 311);
  a gate electrode 151 is formed in the groove and over the gate insulator 108 (for example according to parameters that are the same as those in step 312).

FIG. 20 is a perspective view of an example of a field-effect transistor 2 at an intermediate step in its fabrication method according to a fourth embodiment. FIGS. 21 to 29 are sectional views of the transistor 2 at various steps in its fabrication method according to this fourth embodiment. The transistor 2 is here a finFET transistor, which typically has a gate facing three sides of a channel in the form of a nanowire.

A structure provided with a substrate (not illustrated) surmounted by a dielectric layer 201 is first provided. A nanowire 202 is formed on top of the layer 201.

The composition of the nanowire 202 is for example the same as that of the layer 102 described above. This nanowire 202 is encapsulated in a layer 203, the composition of which is for example the same as that of the layer 103 described above.

The layer 203 is typically deposited by epitaxial growth from the nanowire 202. The thickness of the layer 203 is typically between 2 and 10 nm. Advantageously, the layer 203 is pseudomorphic, i.e. its thickness is less than its critical thickness for relaxation, from which critical thickness it begins to undergo plastic relaxation.

The following steps in the method for fabricating the transistor 2 will be illustrated by sectional views through the nanowire 202 along a plane parallel to the substrate of the structure.

In the configuration illustrated in FIG. 21, the following steps are implemented:
- conformal deposition of a protective layer 204 on top of the layer 203. The protective layer 204 is typically made of SiO$_2$;
- conformal deposition of a layer 205 of amorphous silicon on top of the protective layer 204;
- conformal deposition of a hardmask layer 206 on top of the layer of amorphous silicon 205. The hardmask layer 206 is for example formed of SiN.

In the configuration illustrated in FIG. 22, a lithography step has been carried out. Next, a step of anisotropically etching the layer 206, the layer 205 and the layer 204 is carried out in order to form a sacrificial gate stack 210. The etch is stopped at the layer 203. Next, spacers 220 are formed on either side of the sacrificial gate stack 210 in order to obtain the configuration illustrated in FIG. 22.

In the configuration illustrated in FIG. 23, a step of advantageously anisotropically etching the layer 203 is carried out in order to obtain the element 213 beneath the assembly including the sacrificial gate stack 210 and the spacers 220. The etch is continued to remove the nanowire 202 on either side of the assembly including the sacrificial gate stack 210 and spacers 220 in order to obtain the configuration illustrated in FIG. 23.

In the configuration illustrated in FIG. 24, a raised source 231 and drain 232 are formed on the nanowire 202, on either side of the assembly including the spacers 220 and the sacrificial gate stack 210. The source 231 and drain 232 are typically formed by epitaxial deposition on the exposed portion of the nanowire 202, for example deposition of a silicon alloy or an SiGe alloy (with for example a composition that is equivalent to that described with reference to the source 131 and drain 132).

In the configuration illustrated in FIG. 25, a protective layer 207 is formed on top of the source 231 and the drain 232, on either side of the assembly including the spacers 220 and the sacrificial gate stack 210.

In the configuration illustrated in FIG. 26, the sacrificial gate stack 210 has been removed to form a groove 240 between the spacers 220. This removal operation is for example carried out by means of selective isotropic etching such that the element 213 then forms the bottom of the groove 240.

In the configuration illustrated in FIG. 27, the layer 203 is etched at the bottom of the groove 240 down to the layer 202, stopping at this layer 202. The layer 202 is thus at least partly retained at the bottom of the groove 240 so as to be able to form a channel zone of the transistor 2. The flanks of the groove 240 are partly delimited by lateral faces of the etched layer 203, these lateral faces being aligned with lateral faces of the spacers 220. The doped portion of the accesses to the channel zone, beneath the spacers 220, runs precisely up to this channel zone without encroaching onto this channel zone.

In the configuration illustrated in FIG. 28, the method moves on to forming a gate insulator 208 on the lateral faces and at the bottom of the groove 240. The gate insulator 208 could for example be SiO$_2$ or a material with a high dielectric constant such as HfOx.

In the configuration illustrated in FIG. 29, the method moves on to forming a gate electrode 251 in the groove 240 and over the gate insulator 208. A gate stack 250 is thus formed. The gate metal could for example be the same as that used for the gate electrode 151.

FIG. 30 is a sectional view of a field-effect transistor 2 at an intermediate step in its fabrication method according to a fifth embodiment. The fabrication method according to the fifth embodiment may be implemented starting from the configuration illustrated in FIG. 27 for the fourth embodiment. To obtain the configuration illustrated in FIG. 30, a step of depositing, by epitaxy, a layer of semiconductor material 260 on top of the layer 202 at the bottom of the groove 240 is carried out here. The layer of semiconductor material 260 is thus configured to be included within the channel zone of the transistor. The semiconductor material 260 is for example silicon that is not intentionally doped or silicon with a doping level that is lower than that of the layer 203, when the layer 203 is made of silicon alloy. The semiconductor material 260 is for example an alloy of SiGe that is not intentionally doped or of SiGe with a doping level that is lower than that of the layer 203, when the layer 203 is made of SiGe alloy. The deposition operation 260 is advantageously carried out with a thickness that is equal to that of the layer 203. The upper face of the deposit 260 is advantageously aligned with the upper face of the layer 203. Method steps that are similar to those described with reference to FIGS. 28 and 29 may then be carried out.

The invention claimed is:

1. A method for fabricating a field-effect transistor, the method comprising:
   - providing a structure comprising a first layer of semiconductor material;
   - forming a second layer, which is a doped layer of semiconductor material on top of the first layer, a composition of the second layer being different from a composition of the first layer;
   - forming a sacrificial gate and two spacers made of a dielectric material that are arranged on top of the second layer, the sacrificial gate being arranged between the spacers;
   - removing the second layer on either side of an assembly formed by the sacrificial gate and the spacers;
   - removing the sacrificial gate to form a groove separating the spacers, the second layer being accessible at a bottom of the groove;
   - etching the second layer at the bottom of the groove until reaching the first layer in such a way as to retain the second layer beneath the spacers on either side of the groove; and
   - forming a gate stack in the groove.

2. The method according to claim 1, wherein the first layer is made of silicon alloy.

3. The method according to claim 2, wherein the first layer is made of silicon alloy that is not intentionally doped.

4. The method according to claim 3, wherein, prior to the forming the gate stack in the groove, the method further comprises:
   - depositing, by means of epitaxy, a third layer of an alloy of silicon that is not intentionally doped or with a doping level that is lower than a doping level of the second layer on top of the first layer at the bottom of the groove.

5. The method according to claim 4, wherein the third layer is made of SiGe.

6. The method according to claim 4, wherein the third layer is deposited with a thickness that is identical to a thickness of the second layer present beneath the spacers.

7. The method according to claim 2, wherein the second layer is made of SiGe or silicon alloy.

8. The method according to claim 1, wherein the etching the second layer is carried out by an anisotropic etching.

9. The method according to claim 1, wherein the forming the gate stack comprises depositing a gate dielectric on top of the first layer exposed at the bottom of the groove.

10. The method according to claim 1, wherein:
the method further comprises:
depositing, by means of epitaxy, a silicon alloy above the first layer on either side of the assembly.

11. The method according to claim 1, wherein a thickness of the second layer of the structure provided is between 2 and 5 nm.

12. The method according to claim 1, wherein a width of groove is at most equal to 40 nm.

13. The method according to claim 1, wherein the forming the second layer is carried out by depositing, by means of epitaxy, a layer of doped semiconductor material on top of the first layer so as to form the second layer.

14. The method according to claim 1, wherein in the etching, the second layer at the bottom of the groove is etched until reaching the first layer in such a way as to retain the second layer beneath the spacers on either side of the groove, wherein the entire first layer is also retained.

15. The method according to claim 1, wherein the method is performed at a temperature below 1000° C.

16. The method according to claim 1, wherein the method is compliant with 3D integration.

* * * * *